(12) United States Patent
Sakamoto et al.

(10) Patent No.: US 8,568,602 B2
(45) Date of Patent: Oct. 29, 2013

(54) METHOD OF MANUFACTURING A MAGNETIC READ SENSOR HAVING A LOW RESISTANCE CAP STRUCTURE

(75) Inventors: Koji Sakamoto, Odawara (JP); Atsushi Katou, Odawara (JP); Takao Yonekawa, Odawara (JP); Norihiro Ookawa, Odawara (JP); Kouichi Nishioka, Hiratsuka (JP); Kouji Okazaki, Odawara (JP)

(73) Assignee: HGST Netherlands B.V., Amsterdam (NL)

( * ) Notice: Subject to any disclaimer, the term of this patent is extended or adjusted under 35 U.S.C. 154(b) by 80 days.

(21) Appl. No.: 13/009,738

(22) Filed: Jan. 19, 2011

(65) Prior Publication Data

US 2012/0184053 A1 Jul. 19, 2012

(51) Int. Cl.
*C23F 1/00* (2006.01)
*B44C 1/22* (2006.01)

(52) U.S. Cl.
USPC .................................. 216/22; 216/59; 216/66

(58) Field of Classification Search
None
See application file for complete search history.

(56) References Cited

U.S. PATENT DOCUMENTS

| | | | |
|---|---|---|---|
| 6,621,667 B1 | 9/2003 | He et al. | |
| 6,735,060 B2 | 5/2004 | Gill | |
| 6,791,806 B1 | 9/2004 | Gao et al. | |
| 6,954,341 B2 | 10/2005 | Kamata et al. | |
| 7,241,514 B2 | 7/2007 | Kagami et al. | |
| 7,449,345 B2 | 11/2008 | Horng et al. | |
| 7,497,007 B2 | 3/2009 | Wang et al. | |
| 7,528,457 B2 | 5/2009 | Horng et al. | |
| 7,623,325 B2 | 11/2009 | Jayasekara | |
| 7,656,621 B2 | 2/2010 | Shimazawa et al. | |
| 7,715,156 B2 | 5/2010 | Hirata et al. | |
| 2002/0024778 A1 | 2/2002 | Xue et al. | |
| 2004/0235201 A1* | 11/2004 | Albert et al. | 438/3 |
| 2005/0024790 A1 | 2/2005 | Pinarbasi | |
| 2007/0047153 A1* | 3/2007 | Zeltser | 360/324 |

(Continued)

OTHER PUBLICATIONS

Katada at al., "CPP-GMR Heads With a Current Screen Layer for High Areal Density," Science Direct. Journal of Magnetism and Magnetic Materials, vol. 320, issue 22, Nov. 2008, pp. 2975-2979, abstract only.

(Continued)

*Primary Examiner* — Shamim Ahmed
*Assistant Examiner* — Bradford Gates
(74) *Attorney, Agent, or Firm* — Zilka-Kotab, PC

(57) ABSTRACT

A method for manufacturing a magnetic sensor that decreases area resistance and decreases MR ratio of the sensor by eliminating any oxide formation in the capping layer of the sensor. The method includes forming a sensor stack having a multi-layer capping structure formed there-over. The multi-layer capping structure can include first, second, third and fourth layers. The second layer is constructed of a material that is not easily oxidized and which is different from the first layer. The sensor can be formed using a mask that includes a carbon hard mask. After the sensor stack has been formed by ion milling, the hard mask can be removed by reactive ion etching. Then, a cleaning process is performed to remove the second, third and fourth layers of the capping layer structure using an end point detection method such as secondary ion mass spectrometry to detect the presence of the second layer.

14 Claims, 16 Drawing Sheets

(56) References Cited

U.S. PATENT DOCUMENTS

| | | | |
|---|---|---|---|
| 2007/0068797 A1* | 3/2007 | Jayasekara | 204/192.34 |
| 2008/0094761 A1* | 4/2008 | Freitag et al. | 360/324.12 |
| 2009/0257152 A1 | 10/2009 | Lee et al. | |
| 2009/0269617 A1 | 10/2009 | Zhang et al. | |
| 2009/0284867 A1* | 11/2009 | Zheng | 360/110 |
| 2009/0323230 A1* | 12/2009 | Sasaki | 360/324.12 |
| 2009/0325319 A1* | 12/2009 | Horng et al. | 438/3 |

OTHER PUBLICATIONS

Zheng at al., "Side Shielded TMR Reader With Track-Width-Reduction Scheme," IEEE Transactions on Magnetics, vol. 42, No. 10, Oct. 2006, pp. 2303-2305, abstract only.

Aoshima et al., "Low Resistance Spin-Valve-Type Current-Perpendicular-To-Plane Giant Magnetoresistance With Co75 Fe25," Journal of Applied Physics, vol. 97, No. 10, May 2005, pp. 10C507-10C507-3, abstract only.

* cited by examiner

|  | Cap layer | RA (ohm * um^2) | | | MR ratio (%) | | |
| --- | --- | --- | --- | --- | --- | --- | --- |
|  |  | After forming TMR (A) | After forming USL (B) | B/A | After forming TMR (A) | After forming USL (B) | B/A |
| Comparative Example 1 | Ru 4nm/Ta 3nm/Ru 3nm | 0.84 | 1.04 | 0.2 | 78 | 71 | 91% |
| Working Example 1 | Ru 4nm/Ta 1nm/Ir 2nm/Ru 3nm | 0.85 | 0.95 | 0.1 | 78 | 73 | 94% |
| Working Example 2 | Ru 4nm/Ta 3nm/Ir 2nm/Ru 3nm | 0.84 | 0.85 | 0.01 | 79 | 77 | 97% |
| Working Example 3 | Ru 4nm/Ta 3nm/Ir 1 nm/Ru 3nm | 0.85 | 0.87 | 0.02 | 77 | 75 | 97% |

FIG. 16

METHOD OF MANUFACTURING A MAGNETIC READ SENSOR HAVING A LOW RESISTANCE CAP STRUCTURE

FIELD OF THE INVENTION

The present invention relates to magnetoresistive sensors and more particularly to a method for manufacturing a sensor that prevents oxidation of the capping layer, thereby reducing the area resistance of the sensor by reducing the electrical resistance through the capping layer.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least a coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor, or a Tunnel Junction Magnetoresisive (TMR) sensor can be employed to read a magnetic signal from the magnetic media. The sensor includes a nonmagnetic conductive layer (if the sensor is a GMR sensor) or a thin nonmagnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

A magnetoresistive sensor also includes a capping layer formed at the top of the sensor stack, which is usually formed on top of the free layer. This capping layer, which can be constructed of a material such as Ta, protects the free layer during various manufacturing processes, such as high temperature annealing that is used to pin the magnetization of the pinned layer structure.

One of the parameters that affects the overall performance of a magnetoresistive sensor is the area resistance of the sensor. This resistance, which is not a product of the TMR or GMR effect resulting from spin orientation of electrons through the sensor, reduces the overall signal produced by the sensor. One factor that can disadvantageously affect this area resistance is the oxidation of the capping layer. Current manufacturing processes result in an oxidation of the capping layer, which increases the electrical resistance through this capping layer.

SUMMARY OF THE INVENTION

The present invention provides a method for manufacturing a magnetic sensor that includes forming a sensor stack having a capping layer structure formed there-over, the capping layer including: a first layer comprising Ru; a second layer comprising a material that is not easily oxidized formed over the first layer; a third layer formed over the second layer; and a fourth layer formed over the third layer. A cleaning process is then performed to remove the second, third and forth layers, leaving at least a portion of the first layer remaining.

The sensor stack can be defined by depositing the sensor layers full film, forming a mask structure (including a hard mask layer) over the sensor layers and then performing an ion milling to remove portions of the sensor layers and capping layers that are not protected by the mask structure. A reactive ion milling can then be performed to remove the remaining hard mask.

While this reactive ion etching can cause oxidation of the third and fourth layers, this oxidation does not reach down to the level of the first and second layers. This is because the second layer is constructed of a material that cannot be easily oxidized, such as Ir, Rh, Pd or Pt. This also because the third layer (which can be Ta) is sufficiently thick (e.g. at least 20 Angstroms) that the oxidation does not extend all of the way through the third layer.

Because the first and second layers are not oxidized, an end point detection process can be used to accurately determine when the cleaning process should be terminated to ensure that all of the second layer has been removed. This leaves a capping layer in the finished head that includes no oxide and which, therefore, has a very low electrical resistance leading to reduced area resistance (RA) and increased MR ratio.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIG. 16 is a table showing RA and MR properties for various capping layer structures.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
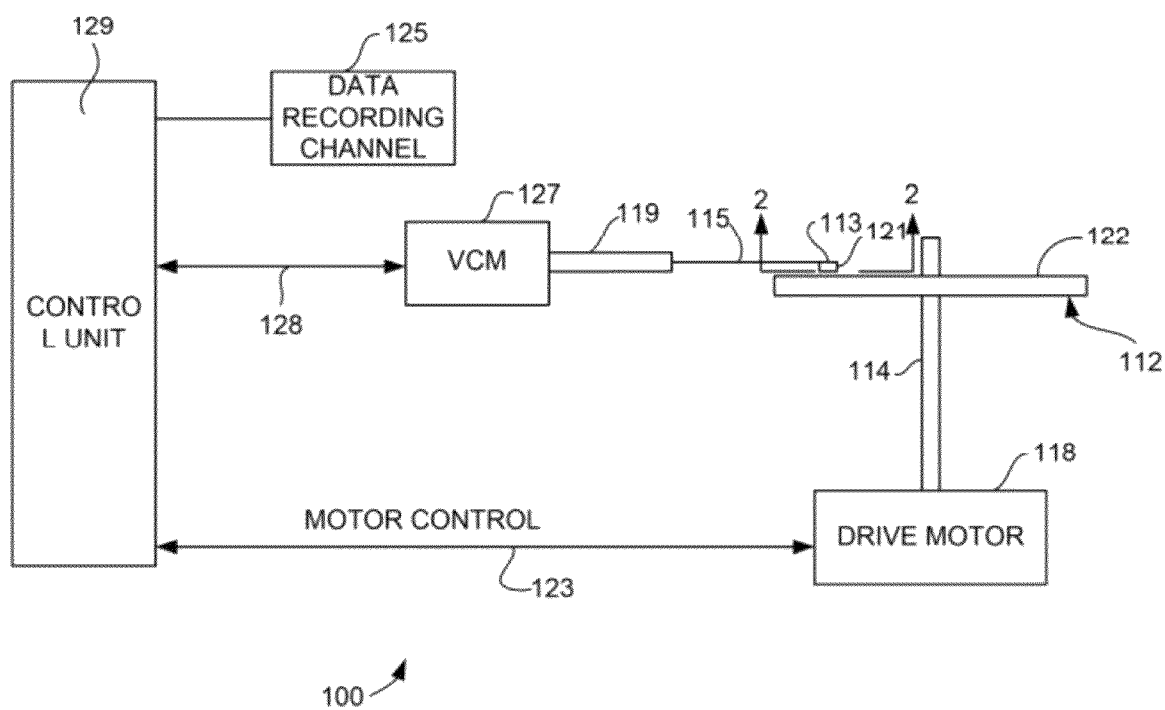
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
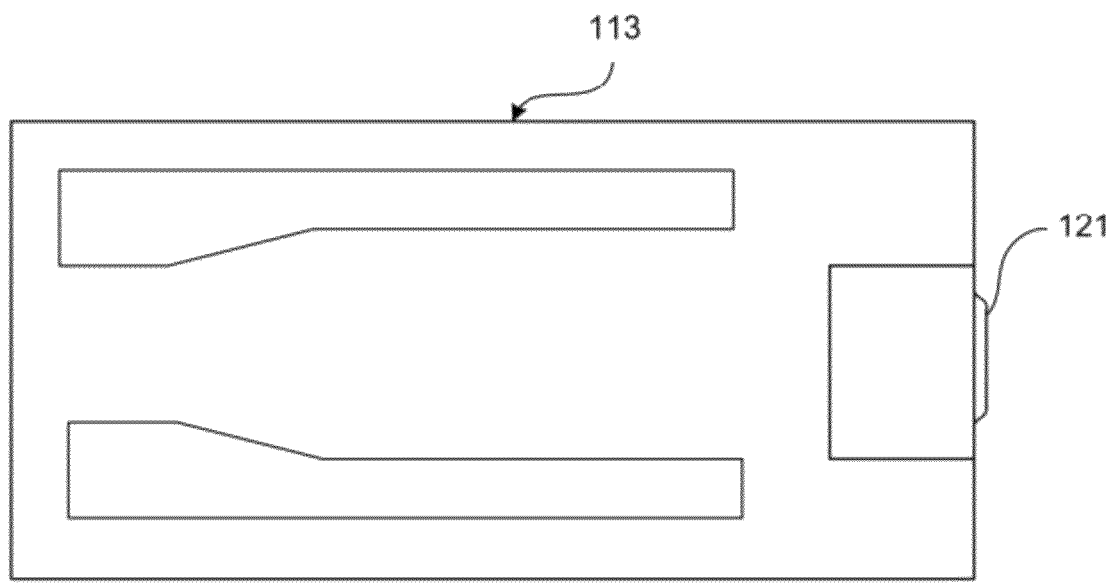
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
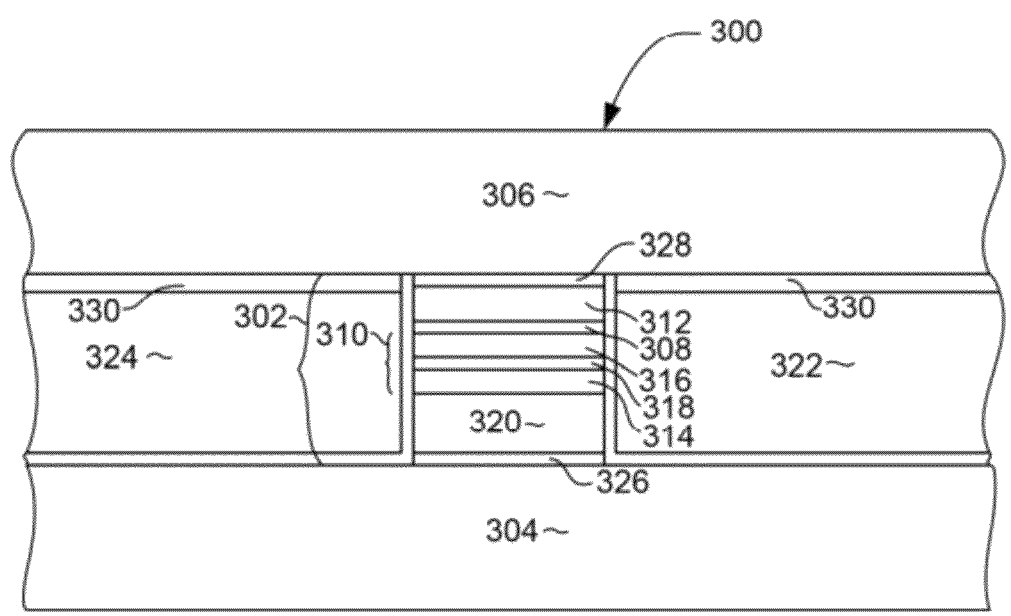
FIG. 3 is an ABS view of an example of a magnetoresistive sensor that might be constructed by a method of the present invention.

FIG. 3 shows an example of a magnetoresistive sensor structure 300 that can be constructed according to a method of the present invention. The sensor structure 300 is seen as viewed from the air bearing surface (ABS). The sensor 300 includes a sensor stack 302 that is sandwiched between first and second, electrically conductive, magnetic shields 304, 306 that also function as electrically conductive leads.

The sensor stack 302 can include a non-magnetic layer 308 that is sandwiched between a magnetic pinned layer structure 310 and a magnetic free layer structure 312. The non-magnetic layer 308 can be an electrically conductive material, if the sensor 300 is a Giant Magnetoresistive (GMR) sensor, and can be a thin electrically insulating material layer if the sensor structure 300 is a Tunnel Junction Sensor (TMR).

The pinned layer structure 310 can include first and second magnetic layers 314, 316 with a non-magnetic, antiparallel coupling layer such as Ru 318 sandwiched between the first and second magnetic layers 314, 318. The first magnetic layer 314 has its magnetization pinned in a first direction perpendicular to the ABS. This pinning is a result of exchange coupling with a layer of antiferromagnetic material 320 such as IrMn. The second magnetic layer 316 has its magnetization pinned in a second direction that is antiparallel with the first direction as a result of antiparallel coupling between the first and second magnetic layers 314, 316 across the antiparallel coupling layer 318.

The magnetic free layer 312 has a magnetization that is biased in a direction that is generally parallel with the ABS, but that is free to move in response to a magnetic field. The biasing of the free layer is provided by a magnetostatic coupling with first and second hard magnetic bias layers 322, 324. One or more seed layers 326 may be provided at the bottom of the sensor stack 302 in order to ensure a desired grain growth of the other layers of the sensor stack 302 deposited thereon.

A capping layer such as Ta 328 is provided at the top of the sensor stack to protect the underlying layers during manufacture. The capping layer 328 is advantageously constructed of an un-oxidized, non-magnetic, electrically conductive metal. Preferably, the capping layer 328 is constructed of Ru. The capping layer 328 is constructed by a method, described in detail herein below, that prevents oxidation of the capping layer, thereby decreasing area resistance and improving overall performance of the magnetoresistive sensor.

In addition, thin insulation layers 330 are provided at either side of the sensor stack 302 and across at least the bottom lead/shield 304 in order to prevent sense current from being shunted through the magnetic bias layers 322, 324. A non-magnetic hard bias cap layer 330 is provided at the top of each of the hard bias layers 322, 324 to provide magnetic spacing between the hard bias layers 322, 324 and the shield 306.

Figure 4:
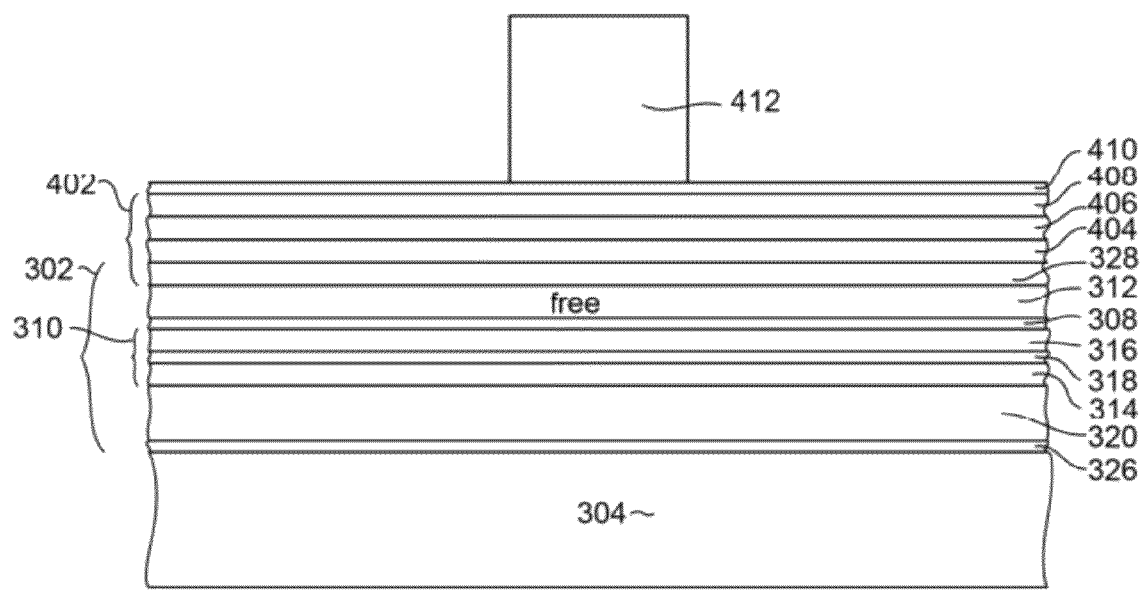
FIGS. 4-9 are views of a magnetoresistive sensor in various intermediate stages of manufacture, illustrating a method of manufacturing a magnetoresistive sensor according to an embodiment of the invention.

FIGS. 4-9 illustrate a method for manufacturing a magnetoresistive sensor having an un-oxidized capping layer 328 for improved, reduced area resistance (RA). With particular reference to FIG. 4, a series of sensor layers 302 is deposited over a shield 304. The series of sensor layers 302 can include the layers 326, 320, 314, 318, 316, 308, 312, 328 described above with reference to FIG. 3.

A series of layers 402 are deposited over the sensor layers 402. This series of sensor layers 402 includes a first layer 328, which will become the capping layer of the finished sensor as described above in FIG. 3. This first layer 328 is preferably constructed of Ru.

The series of capping layers 402 also includes a second capping layer 404, formed over the first layer 328. The second layer 404 is constructed of a material that cannot easily oxidize. The second layer 404 is also constructed of a different material than the first layer 328 for end point detection purposes. To this end, the second layer 404 can be any one of Ir, Rh, Pd, Pt, or a non-magnetic layer containing at least one of these materials. The second capping layer 404 is preferably Ir. The third capping layer 406 can include any one of Ta, Ti, Zr, Nb, Hf, V, Al, Si or a combination of these materials. The third capping layer is preferably Ta. The fourth capping 408 is formed over the third capping layer 406 and can be constructed of Ru.

A hard mask layer 410 is deposited over the multi-layer capping layer structure 402. The hard mask layer 410 is preferably constructed of carbon, more preferably diamond like carbon (DLC). Then, a layer of photoresist 412 is deposited over the hard mask layer 410. The photoresist layer 412 is photolithographically patterned and developed to form a mask 412 configured to defined a sensor track width. It should be pointed out that other layers may be included between the hard mask 410 and photoresist layer 412, such as an image transfer layer (such as DURIMIDE®), a RIE hard mask formed over the image transfer layer and a bottom anti-reflective coating layer (BARC) formed directly beneath the photoresist layer 412. However, these layers have not been shown for purposes of clarity.

Figure 5:
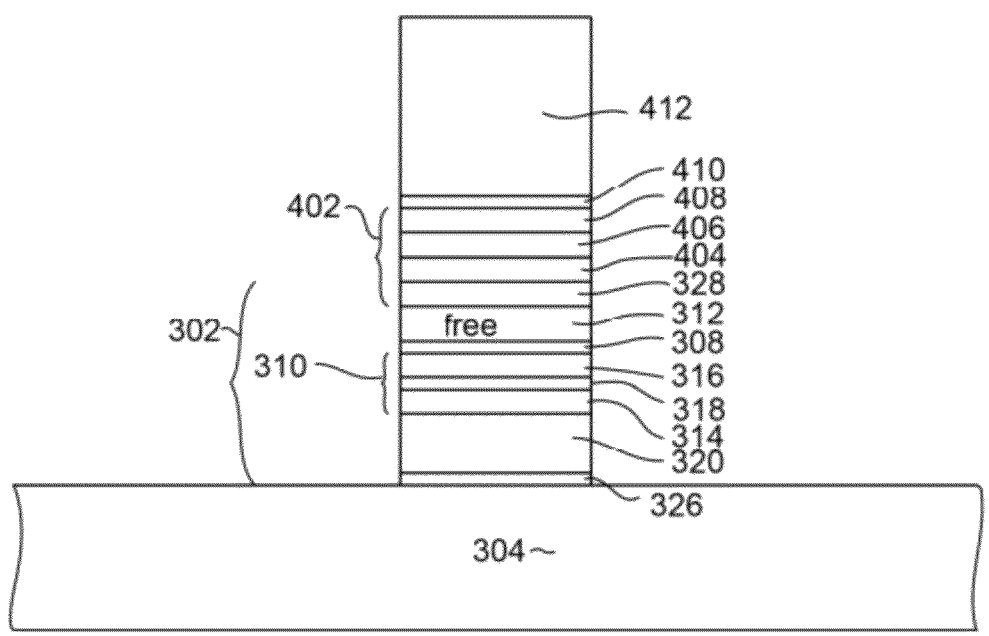

After the photoresist mask 412 has been formed by photolithographic patterning, an ion milling is performed to remove portions of the capping layers 402 and sensor layers 302 to form a sensor stack 302 and capping structure 402 as shown in FIG. 5. This ion milling can be a multi-step ion milling performed at various angles to form, as much as possible, straight vertical side walls on the sensor stack 302 with minimal re-deposited material at the sides.

Figure 6:
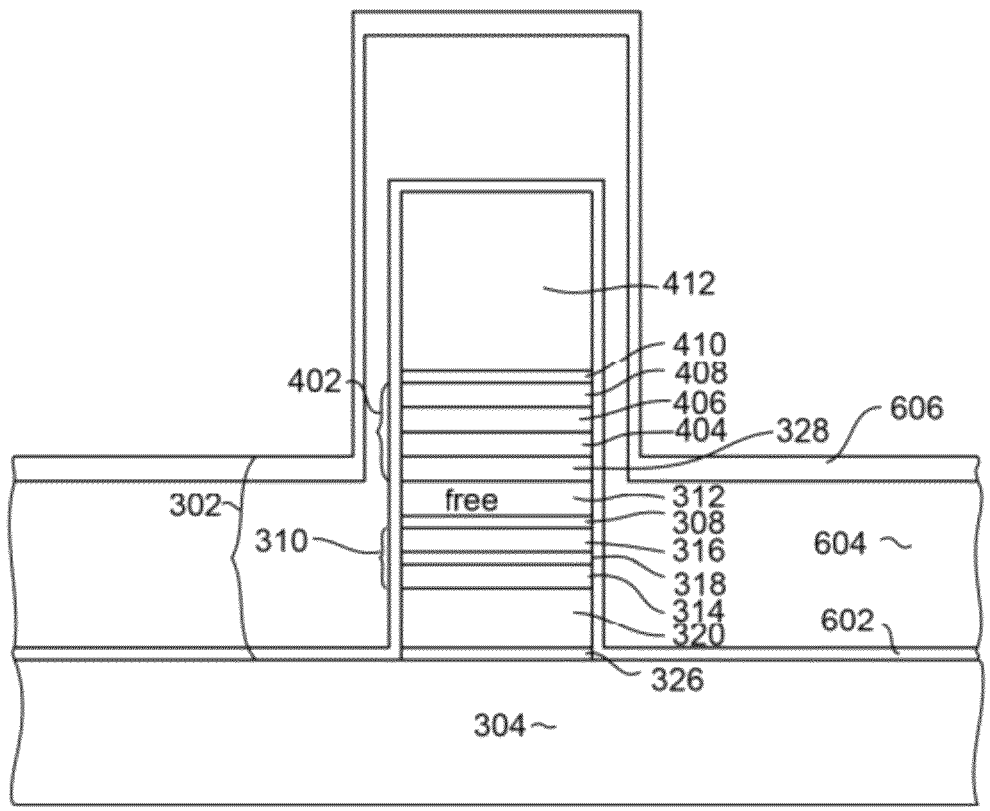

Then, with reference to FIG. 6, a thin, non-magnetic, electrically insulating layer 602 is deposited over the sensor stack 302, mask 412 and bottom shield 304. This thin, non-magnetic, electrically insulating layer 602 is preferably constructed of alumina and is preferably deposited by atomic layer deposition (ALD). A hard bias layer 604 is then deposited. The hard bias layer is preferably CoPt or could be CoPtCr or a combination of these materials. The hard bias structure 604 could also include one or more seed layers (not shown). The hard bias structure 604 is preferably deposited to a thickness to extend at least to the top of the free layer 312. A hard bias capping layer 606 is then deposited over the hard bias layer 604. The hard bias capping layer 606 can be constructed of Ta, Cr of a combination of these materials.

Figure 7:
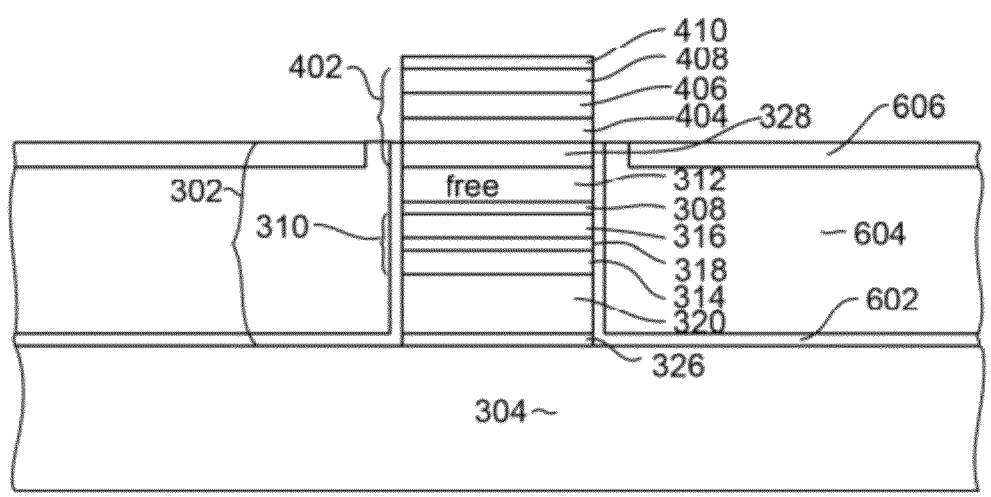
Figure 8:
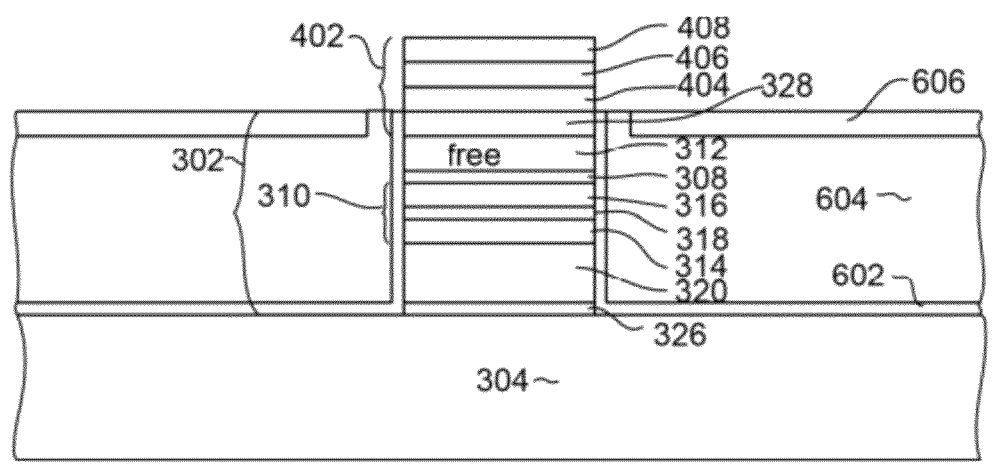

After the layers 602, 604, 606 have been deposited, the photoresist mask 412 is removed, leaving a structure as shown in FIG. 7. This can be accomplished by first performing a glancing angle ion milling to remove portions of the layers 602, 604, 606 from the sides of the mask 412, thereby exposing the mask 412. A chemical liftoff process can then be performed to remove the mask 412. As can be seen in FIG. 7, this leaves the carbon hard mask 410 over the capping layer structure 402. This capping layer 410 can then be removed by reactive ion etching in an appropriate chemistry that preferentially removes carbon, thereby leaving a structure as shown in FIG. 8.

The presence of the capping layer structure 402 protects the sensor during various manufacturing processes that would otherwise damage the free layer and, also prevents oxidation of the free layer prior to formation of the top shield (which will be described herein below). An example of manufacturing processes that the capping structure 402 protects the free layer 312 against includes the high temperature annealing used to set the magnetizations of the pinned layer structure 310 and also the annealing used to set the magnetization of the hard bias layers 604.

After the above described high temperature annealing has been completed, layers 404, 406, 408 of the capping layer structure 402 are not needed and are removed to decrease electrical area resistance of the sensor. The layers 404, 406, 408 can then be removed by a cleaning process that will be described in detail herein below. However, before discussing the advantages of the present invention, especially with regard to this cleaning process it is helpful to first discuss a prior art capping layer, cleaning process and the disadvantages associated therewith.

Prior art capping layers have consisted of a first layer of Ru, a layer of Ta over that and a second layer of Ru over the layer of Ta (not shown). This multi-layer cap has been used to protect the sensor layers during the above described annealing processes. After these processes have been performed, a cleaning process has been used to remove the top Ru layer and the Ta middle layer. The bottom Ru layer has used as an end point detection layer to determine when the cleaning/removal process should be terminated. Compared to the area resistance (RA) and the MR ratio before the cleaning/removal process the area resistance RA increases and the MR ratio decreases after the cleaning/removal process. After lengthy investigation, the inventors have discovered that the cause of this problem is residual tantalum oxide remaining in the cap structure which has not been adequately removed by the cleaning process. The Ta layer, sandwiched between the upper and lower Ru layers, becomes oxidized during the reactive ion etching that was performed to remove the carbon hard mask layer 410 (FIG. 7). This oxidation may even extend into the lower Ru layer. As mentioned above, an endpoint detection process is used to terminate the cleaning process when the bottom Ru layer has been reached. A method such as Secondary Ion Mass Spectrometry (SIMS) can be used to detect when the bottom Ru layer has been reached. However, such a method detects the presence of Ru even though the portion of the bottom Ru layer that has been reached is actually an oxide layer. As a result, the cleaning process terminates with a high electrical resistance Ru oxide layer remaining.

The present invention overcomes this problem, leaving a capping layer in the finished sensor that has no oxide and therefore provides a very low area resistance (RA) and a high magnetoresistance MR ratio. As discussed above, the layer 404 is constructed of a material that does not easily oxidize. Oxidation of this second layer 404 can be further prevented by constructing the third layer 408 to at least a prescribed thickness, preferably at least 20 Angstroms.

As mentioned above the hard mask layer 410 (FIG. 6) (which is preferably diamond like carbon (DLC)) is removed by reactive ion etching (RIE). This process oxidizes a portion of the cap layer structure 402. More particularly, this RIE process oxidizes the top Ru layer 408 causing the layer 408 to become Ru—Ox. This oxidation extends into the third layer 406. By making the third layer 406 sufficiently thick, this oxidation can be prevented from reaching through the entire depth of the third layer 406, stopping somewhere within the third layer 406. Therefore, the bottom of the third layer 406 (adjacent to the second layer 404) is not oxidized. In addition, as mentioned above, the second layer 404 is constructed of a material that cannot easily oxidize. Therefore, the second layer 404 is not oxidized at all by the RIE process used to remove the hard mask layer 410.

After the RIE has been performed to remove the hard mask layer 410, a cleaning process is performed to remove unwanted portions of the mask structure 402. This cleaning process is performed sufficiently to leave only the bottom capping layer 328 remaining. The cleaning process can be an ion milling process and is performed until Ru first layer 404 has been reached. An end point detection method such as Secondary Ion Mass Spectrometry (SIMS) or some other suitable method can be used to detect which layer has been reached by the ion milling. As discussed above, in prior art processes the oxidation of the Ta layer made accurate end point detection very difficult and inaccurate. As a result, the cleaning process used with such prior art processes resulted in a significant amount of the high resistivity Ta—Ox remaining over the sensor, thereby greatly increasing the area resistance (RA) of the sensor. In the present invention however, because the second capping layer 404 is not oxidized at all, the end point detection process can be extremely accurate. This means the cleaning process can be terminated after all of the second layer 404 has been removed, leaving only an un-oxidized layer of Ru 328 over the sensor. This greatly reduces the area resistance (RA) of the finished sensor and increases the magnetoresistance MR of the sensor. What's more, even if some of the layer 404 remains, this layer is an un-oxidized metal, and would therefore not significantly increase RA in the finished sensor.

Figure 9:
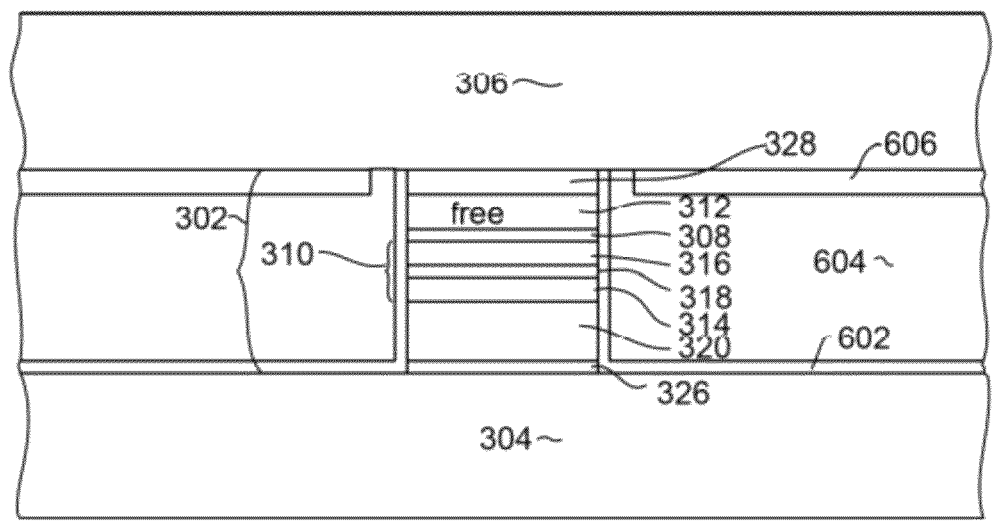

Once the layers 404, 406, 408 have been removed by the cleaning process, an upper magnetic shield 306 can be formed over the sensor, leaving the structure as shown in FIG. 9. The formation of the magnetic shield 306 can be accomplished by electroplating. A seed layer can be deposited, and then an electroplating frame mask (not shown) can be formed having an opening configured to define a shield. Then an electroplating process can be performed to deposit a magnetic material such as NiFe or CoFe into the opening in the mask. The mask can then be removed, and a quick ion milling can be performed to remove portions of the remaining seed layer in areas outside of where the shield is.

The above described detection of the cap layers 328, 404, 406, 408 can be better understood with reference to FIGS. 10-15. FIGS. 10, 12, 13, 14 and 15 are graphs showing the respective detection intensity (in the vertical axis) of Ir, Ru and Ta when the cap layer 402 consists of the first cap layer 328 formed of Ru, the second cap layer 404 formed of Ir, the third cap layer 406 formed of Ta and the fourth cap layer 408 formed of Ru with the thickness of the third cap layer 406 being varied from 10 Angstroms to 20 Angstroms and 30 Angstroms. The horizontal axis is the time (in seconds).

Figure 10:
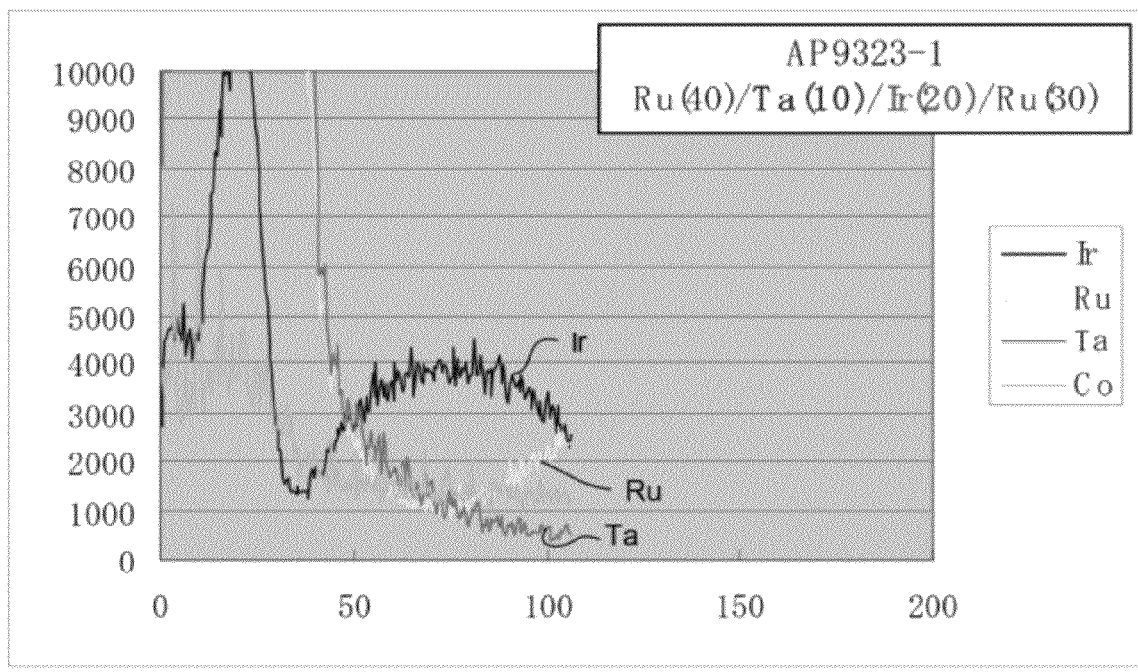
FIGS. 10-15 are graphs showing spectral intensities for various capping layer structures.

FIG. 10 shows the intensity when the fourth cap layer 408 has a thickness of 40 Angstroms, the third cap layer 406 has a thickness of 10 Angstroms, second cap layer 404 has a thickness of 20 Angstroms and the first cap layer 328 has a thickness of 30 Angstroms. If originally a unique Ir peak appearing near 70 seconds on the x axis becomes the detection point, the oxidation passes through the Ta and reaches through the surface of the Ir in the second cap layer 404, and the Ir surface is oxidized because the film thickness of the third cap layer 406 (constructed of Ta) is extremely thin. Therefore, another Ir detection peak appears sooner near 20 (s), and accurate Ir detection may not be possible. When accurate Ir detection is not possible, the end point in the cleaning process is offset. As a result, tantalum oxide remains and causes an increase in the area resistance (RA).

Figure 11:
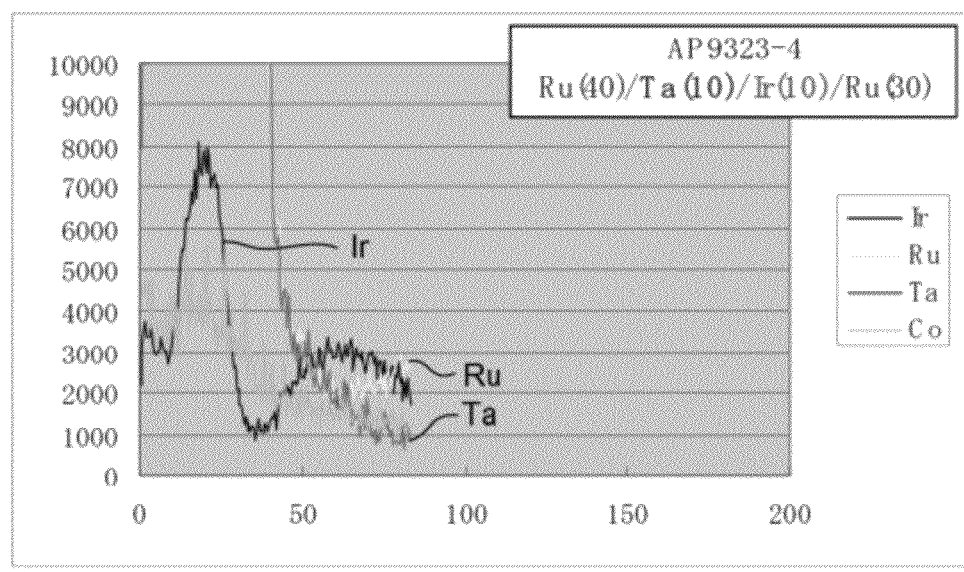

FIG. 11 shows a 4-layer structure of the cap layer 402 with 20 Angstrom thick Ta third cap layer 406. When the thickness of the third cap layer 406 is 20 Angstroms, the Ir peak intensity correctly appears near 110 seconds and end point detection can be accurate.

Figure 12:
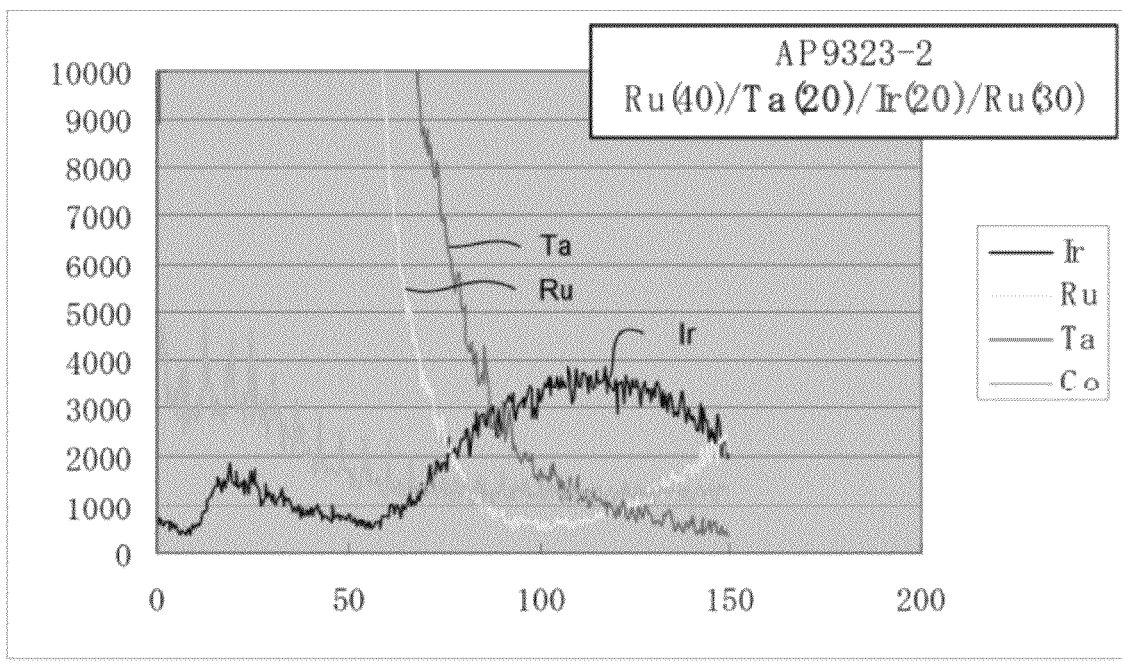

FIG. 12 shows the 4 layer structure 402 of the cap layer with a 30 Angstrom thick third cap layer 406. When the thickness of the third cap layer 406 is 30 Angstroms, the Ir peak correctly appears near 15 seconds, and end point detection is accurate. From the above, it can be seen that the third cap layer 406 is preferably at least 20 Angstroms. If the third layer 406 has a thickness of at least 20 Angstroms, the oxidation of the third layer 406 caused by the removal of the capping layer 410 does not reach all of the way through the third cap layer 406 and, therefore, does not reach the second cap layer 404. Therefore, in the cleaning process with the second cap layer 404 as the end point detection layer, the end point detection can be accurate, and the problems of the increased area resistance (RA) and the decrease in the MR ratio can be avoided.

Figure 13:
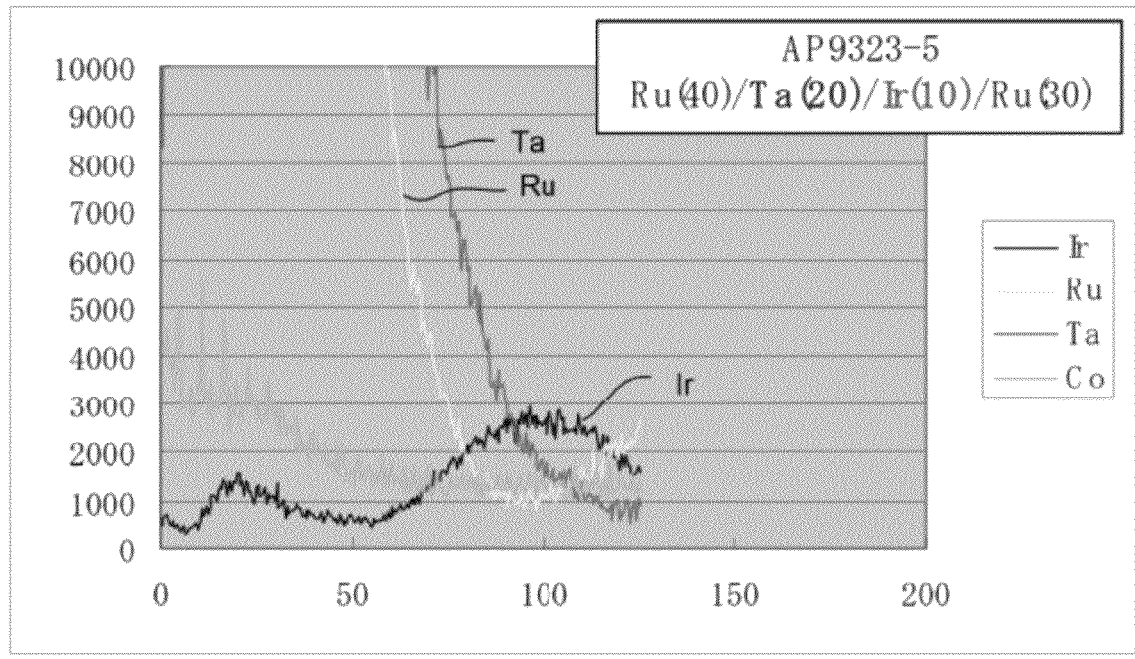
Figure 14:
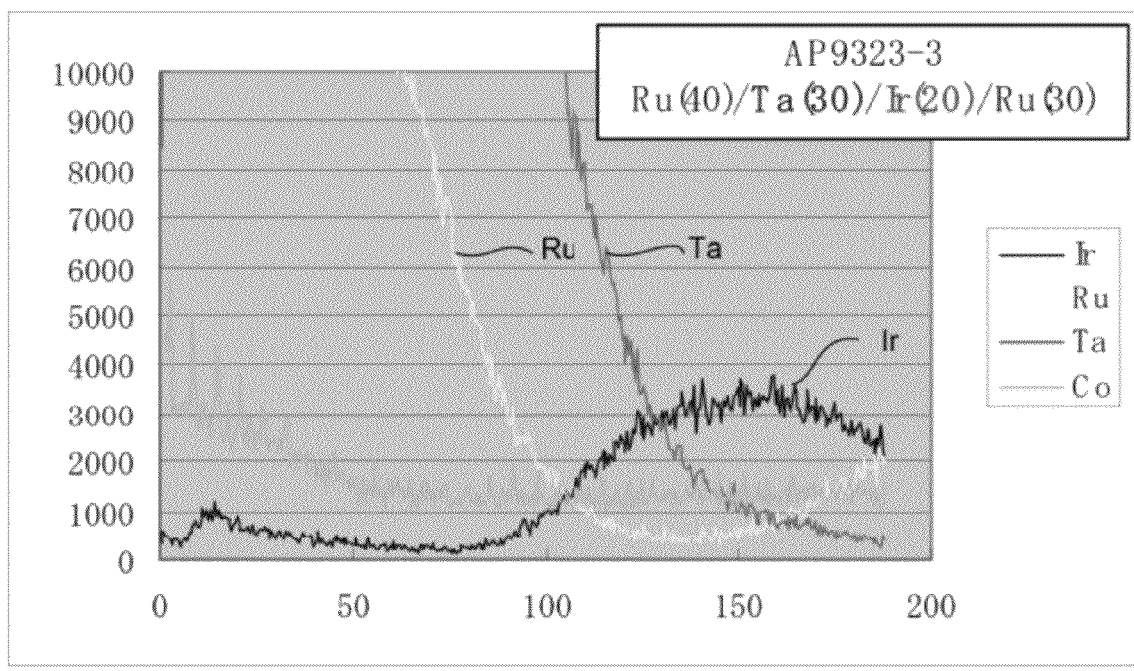
Figure 15:
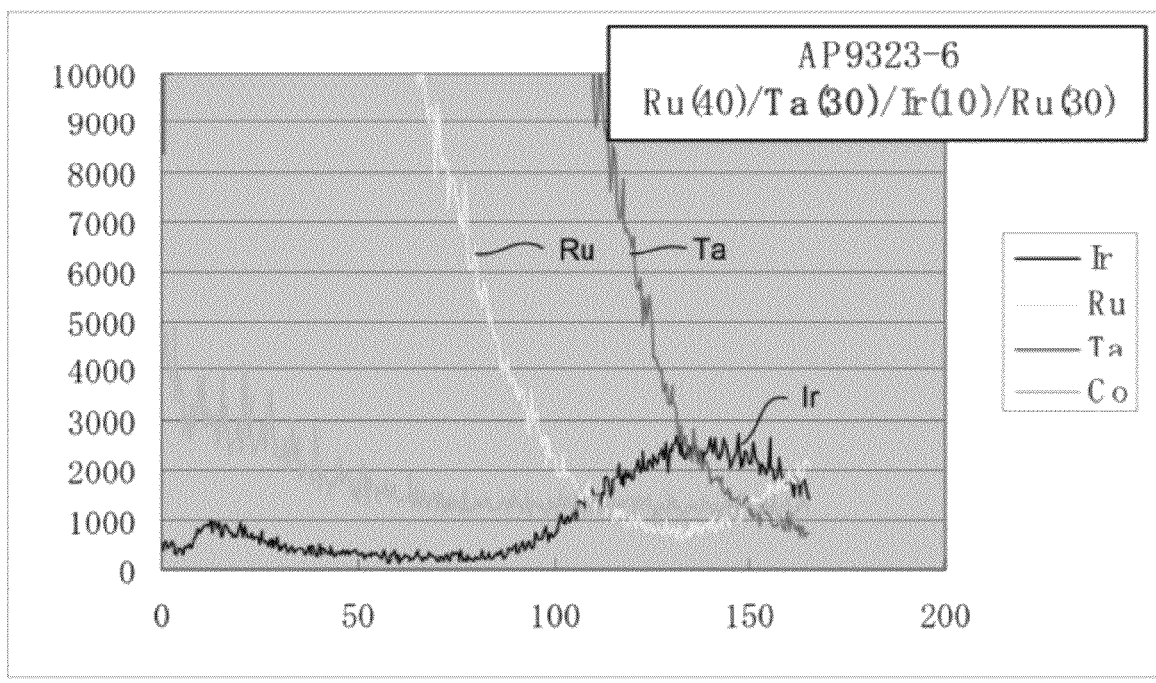

In FIGS. 13, 14 and 15, show the detection intensity of the capping layers when the second layer 404 (constructed of a difficult to oxidize material) was thinned to just 10 Angstroms and the thickness of the third cap layer 406 was 10 Angstroms (FIG. 13) 20 Angstroms (FIG. 14) and 30 Angstroms (FIG. 15) respectively. Again, the horizontal axis in these Figures represents time in seconds (s).

FIG. 13 shows the intensity for a 4 layer cap structure where the first layer 328 is 30 Angstroms of Ru; the second layer 404 is 10 Angstroms of Ir; the third layer 406 is 10 Angstroms of Ta; and the fourth layer 408 is 40 Angstroms of Ru. If originally the unit Ir peak appearing near 60 seconds in the X axis becomes the detection point, because the Ta film thickness of the third capping layer 406 is extremely thin, as in FIG. 10, the oxidation passes through the layer 406. This causes another Ir detection peak to appear sooner near 20 seconds, and accurate Ir detection is not possible. The end point in the cleaning process is offset. As a result, tantalum oxide remains and causes an increase in the area resistance (RA).

FIG. 14 shows the 4-layer cap layer structure 402 where the first layer 328 is 30 Angstroms of Ru; the second layer 404 is 10 Angstroms of Ir; the third layer 406 is 20 Angstroms of Ta; and the fourth layer 408 is 40 Angstroms of Ru. When the third layer 406 has a thickness of 20 Angstroms, the Ir peak correctly appears near 100 seconds, and end point detection can be accurate. In this working example, the Ir film thickness of the second cap layer 404 is thinned to a 10 Angstrom film, but if the thickness of the third cap layer 406 is sufficiently thick, not only is the oxidation suppressed at the Ta layer and does not reach the Ir layer, even in the outer edges of end point detection the Ir peak correctly appears and the detection sensitivity can be improved and maintained. In addition, FIG. 15 shows the 4-layer cap structure 402 where the first layer 328 is 30 Angstroms of Ru the second layer 404 is 10 Angstroms of Ir; the third layer is 30 Angstroms of Ta; and the fourth layer 408 is 30 Angstroms of Ru. With a 30 Angstrom thick third layer 406, the Ir peak correctly appears near 150 seconds and accurate end point detection is possible. From the above, it can be seen that the thickness of the third cap layer 406 is preferably at least 20 Angstroms, and accurate end point detection is possible in the second cap layer 404, which is an extremely thin, difficult to oxidize material.

Next, the table in FIG. 16 shows the evaluation results of the characteristics of the TMR playback sensor in the working examples. The area resistance RA and MR ratio are compared after formation of the sensor stack 302 (FIG. 8) and after formation of the upper shield 306 (FIG. 9). The ratio B/A represents the ratio of properties before formation of the shield (A) and after formation of the shield (B). Specifically, table shows how these properties change after the hard mask removal and cap cleaning process described above have been performed.

Comparative Example 1 shows the case of a Ru(4 m)/Ta (3 nm)/Ru(3 nm) cap layer structure of the prior art. In this case, the area resistance RA increases by 0.2 (ohm*um$^2$), and the MR ratio is 91%, that is, 9% lower.

By contrast, in the structure of Working Example 1 (Ru(4 nm)/Ta (1 nm)/Ir(2 nm)/Ru(3 nm)), the Ta layer of the third cap layer 406 (FIG. 8) is a thin 1 nm, but the increase in the area resistance RA is limited to 0.1 (ohm*um$^2$), and the decrease in the MR ratio is limited to 6%.

In Working Example 2, the structure of the cap layer 402 is (Ru (4 nm)/Ta(3)nm/Ir(2 nm)/Ru(3 nm), and the film thickness of the third cap layer 706 is thickened to 3 nm. In this case, the increase in the area resistance RA is a very small 0.01 (ohm*um$^2$), and the decrease in the MR ratio is a very small 3%.

In Working Example 3, the structure of the cap layer 402 is Ru4 nm)/Ta(3 nm)/Ir(1 nm)/Ru(3 nm). The film thickness of the third cap layer 406 is 3 nm and the film thickness of the second cap layer 404 is thinned to just 1 nm. In this case too, as in the Working Example 2, the increase in the area resistance RA is limited to a small value, and the decrease in the MR ratio is also limited to a small value.

From the above, it can be seen that Working Examples 1, 2 and 3 show a structure in which the intermediate processes have more difficulty degrading the characteristics of the TMR sensor such as the area resistance RA and the MR ratio than does the prior art Comparative Example 1. In addition, sufficient film thickness of the third cap layer 406, as in Working Examples 2 and 3, can further minimize degradation of the characteristics described above.

In the working examples, the second cap layer was described as being Ir, but could be made of any one of Rh, Pd, Pt or a non-magnetic layer having at least any one of these materials. Similarly, the third cap layer 406 was described as being Ta, but could be Ti, Zr, Nb, Hf, V, Al, Si or a non-magnetic layer having at least one of these materials.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic sensor, comprising:
   forming a sensor stack having a capping layer structure formed there-over, the capping layer including a first layer comprising Ru, a second layer comprising Ir, Rh, Pd or Pt formed over the first layer, a third layer comprising Ta, Ti, Zr, Nb, Hf, V, Al, or Si and having a thickness of at least 20 Angstroms formed over the second layer and a fourth layer formed over the third layer, the fourth layer being compositionally distinct from the third layer; and
   performing a cleaning process to remove the second, third and fourth layers, leaving at least a portion of the first layer remaining,
   wherein the second layer is a different material than the first layer.

2. The method as in claim 1 further comprising, using end point detection to detect the presence of the second layer to determine when the cleaning process should be terminated.

3. The method as in claim 1 wherein the first layer comprises Ru, the second layer comprises Ir, the third layer comprises Ta and the fourth layer comprises Ru.

4. The method as in claim 1 wherein the cleaning process comprises ion milling.

5. A method for manufacturing a magnetic sensor, comprising:
   depositing a plurality of sensor layers;
   depositing a series of capping layers over the sensor layers, the series of capping layers comprising a first layer, a second layer formed over the first layer, a third layer formed over the second layer, and a fourth layer formed over the third layer, the fourth layer being compositionally distinct from the third layer;
   forming a mask structure over the sensor layers, the mask structure including a hard mask layer formed directly over the series of capping layers;
   performing an ion milling to remove portions of the capping layers and sensor layers that are not protected by the mask;
   performing a reactive ion etching to remove the hard mask layer; and
   after performing the reactive ion etching, performing a cleaning process to remove the second, third and fourth layers of the series of capping layers;
   wherein the third layer is sufficiently thick to prevent oxidation from the reactive ion etching from reaching the second layer, and
   wherein the second layer is a different material than the first layer.

6. The method as in claim 5 wherein the hard mask layer comprises carbon.

7. The method as in claim 5 wherein the first layer comprises Ru, the second layer comprises Ir, the third layer comprises Ta and the fourth layer comprises Ru.

8. The method as in claim 5 wherein the first layer comprises Ru and the second layer comprises Ir, Rh, Pd or Pt.

9. The method as in claim 5 wherein the third layer comprises Ta, Ti, Zr, Nb, Hf, V, Al or Si.

10. The method as In claim 5 wherein the first layer comprises Ru, the second layer comprises Ir, Rh, Pd or Pt and the third layer comprises Ta, Ti, Zr, Nb, Hf, V, Al or Si.

11. The method as in claim 5 wherein an end point detection is used to detect the presence of the second layer in order to determine when the cleaning process should be terminated.

12. The method as in claim 11 wherein the end point detection comprises secondary ion mass spectrometry.

13. The method as in claim 11 wherein the third layer comprises Ta, Ti, Zr, Nb, Hf, V, Al or Si and has a thickness of at least 20 Angstroms.

14. The method as in claim 11 wherein the third layer comprises Ta and has a thickness of at least 20 Angstroms.

* * * * *